(12) United States Patent
Takagi

(10) Patent No.: US 8,759,838 B2
(45) Date of Patent: Jun. 24, 2014

(54) PACKAGE AND FABRICATION METHOD OF THE SAME

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 270 days.

(21) Appl. No.: 13/088,722

(22) Filed: Apr. 18, 2011

(65) Prior Publication Data

US 2012/0032190 A1 Feb. 9, 2012

(30) Foreign Application Priority Data

Aug. 6, 2010 (JP) ................ 2010-176926

(51) Int. Cl.
*H01L 29/161* (2006.01)
*H01L 29/20* (2006.01)
*H01L 21/50* (2006.01)
*H01L 23/373* (2006.01)

(52) U.S. Cl.
USPC .......... 257/77; 257/712; 257/76; 257/E23.11; 257/E29.084

(58) Field of Classification Search
USPC ........ 257/77, 712, 76, E23.11, E29.084, 702, 257/677; 438/122, 108
See application file for complete search history.

(56) References Cited

U.S. PATENT DOCUMENTS

| 5,939,214 | A * | 8/1999 | Mahulikar et al. ............ 428/626 |
| 7,605,465 | B2 | 10/2009 | Takagi |
| 2006/0138655 | A1 * | 6/2006 | Takagi .......................... 257/728 |
| 2010/0091477 | A1 | 4/2010 | Takagi et al. |
| 2010/0140721 | A1 * | 6/2010 | Takagi .......................... 257/401 |
| 2012/0307514 | A1 * | 12/2012 | Brukilacchio et al. ........ 362/555 |

FOREIGN PATENT DOCUMENTS

| JP | 3-266457 | A | 11/1991 |
| JP | 4-206955 | | 7/1992 |
| JP | 5-166957 | A | 7/1993 |
| JP | 10-270613 | | 10/1998 |
| JP | 2000-183222 | | 6/2000 |
| JP | 2001-105124 | | 4/2001 |
| JP | 3336982 | | 8/2002 |
| JP | 2003-85843 | A | 3/2003 |
| JP | 2004-327711 | A | 11/2004 |
| JP | 2005-183942 | A | 7/2005 |
| JP | 2006-505951 | A | 2/2006 |
| JP | 2006-344764 | A | 12/2006 |
| JP | 2007-59875 | A | 3/2007 |
| JP | 2007-66797 | A | 3/2007 |
| JP | 2008-112810 | A | 5/2008 |
| JP | 2009-16621 | | 1/2009 |
| JP | 2009-43851 | A | 2/2009 |
| JP | 2010-67660 | A | 3/2010 |
| JP | 2010-161348 | A | 7/2010 |
| WO | WO 2006/061937 | A1 | 6/2006 |

OTHER PUBLICATIONS

Office Action issued Dec. 19, 2013 in Japanese Patent Application No. 2010-176926 (with English-language translation).
Notification of Reasons for Refusal issued May 21, 2013 in Japanese Patent Application No. 2010-176926 (with English translation).

* cited by examiner

*Primary Examiner* — Cathy N Lam
(74) *Attorney, Agent, or Firm* — Oblon, Spivak, McClelland, Maier & Neustadt, L.L.P.

(57) ABSTRACT

According to one embodiment, provided are a package utilized for a high frequency semiconductor device and a fabrication method for such the package, the package including: a conductive base plate including a CTE control layer composed of compound material, and a heat conduction layer disposed on the CTE control layer and composed of Cu.

13 Claims, 9 Drawing Sheets

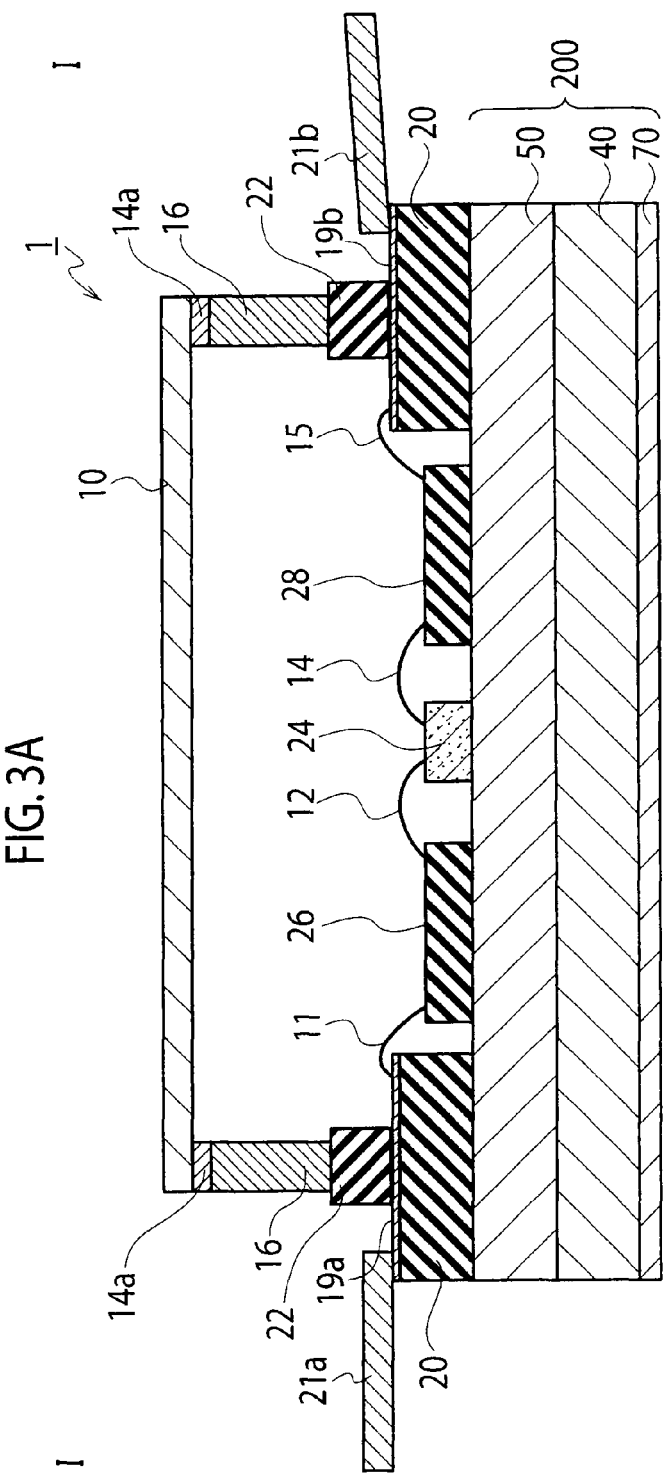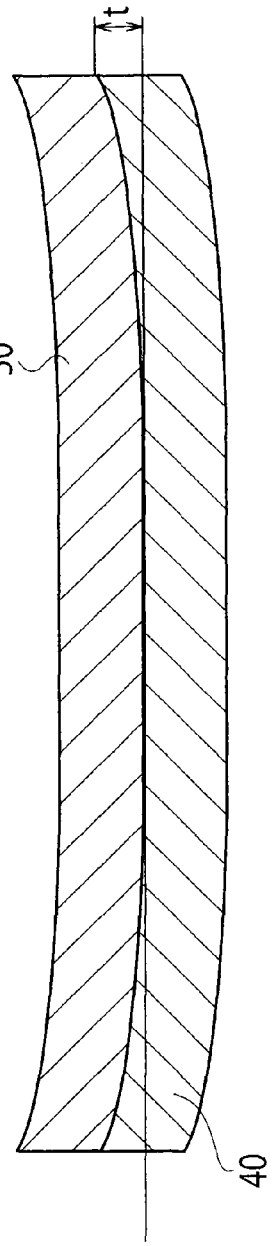

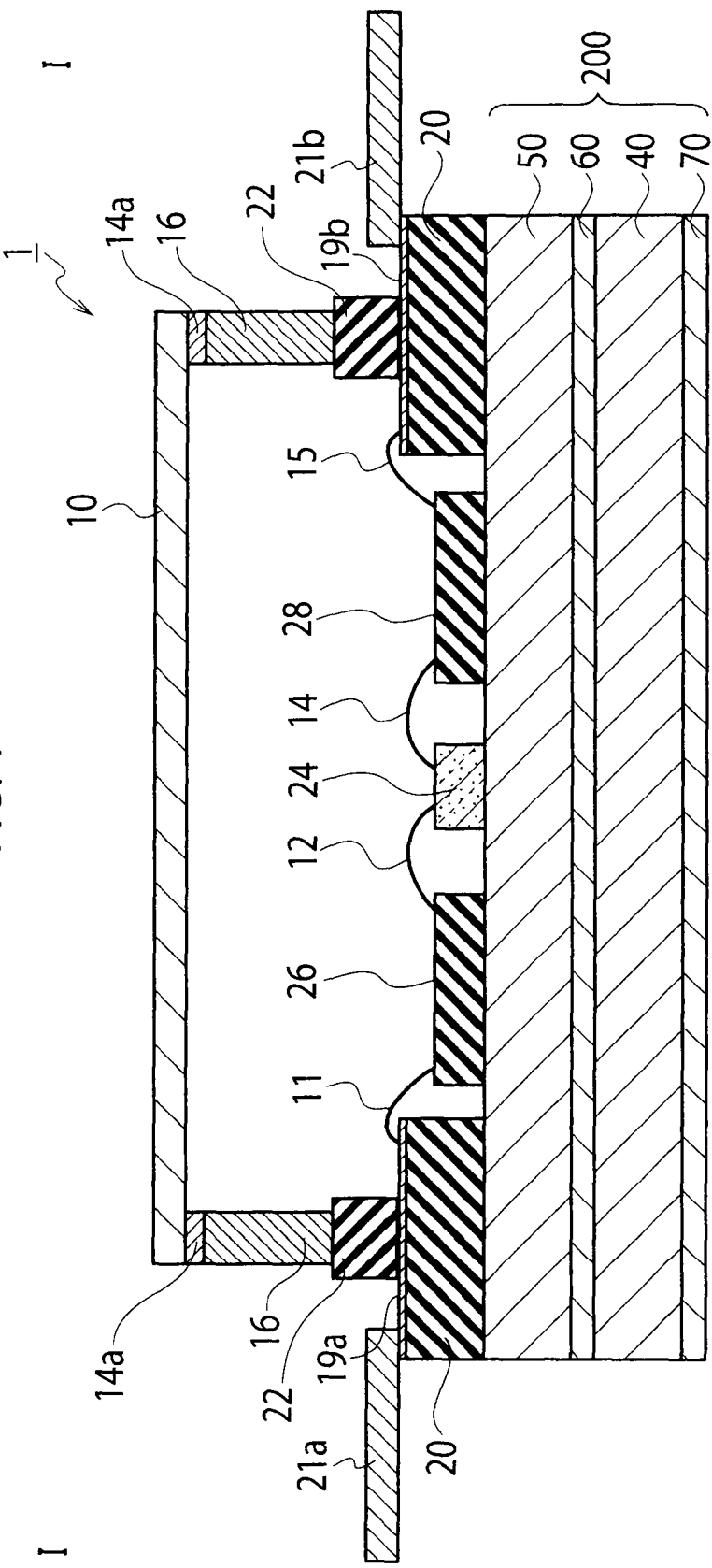

PACKAGE AND FABRICATION METHOD OF THE SAME

CROSS REFERENCE TO RELATED APPLICATIONS

This application is based upon and claims the benefit of priority from prior Japanese Patent Application No. P2010-176926 filed on Aug. 6, 2010, the entire contents of which are incorporated herein by reference.

FIELD

Embodiments described herein generally relate to a package and a fabrication method for such package.

BACKGROUND

Conventionally, a resin-sealed type semiconductor device and a sealed and airtight type semiconductor device are known as an a semiconductor device housing a packaged semiconductor element.

The resin-sealed type semiconductor device has a structure which embedded directly the semiconductor element mounted in a leadframe in the resin by using a transfer mold etc., and is widely used by the advantage, such as low cost, being suitable for mass production, and a miniaturization being possible.

The sealed and airtight type semiconductor device has a structure which performed in hollow airtight maintenance of the semiconductor element mounted on a base substance composed of insulating materials, such as ceramics. Although the cost is higher compared with the resin-sealed type semiconductor device, the sealed and airtight type semiconductor device is used when high reliability is required because of excellent in airtightness.

In recent years, enlargement, densification, and high integration of a semiconductor element have advanced, and therefore the heating power occurred at the time of operation of the semiconductor element has increased rapidly.

In the sealed and airtight type semiconductor device, it is known about a sealed and airtight type semiconductor device which mounts a semiconductor element directly on the heat radiation body composed of metal.

A copper (Cu) based package can radiate the generated heat satisfactory. On the other hand, warping of the base plate or crack of an alumina substrate had occurred because of thermal expansion difference with the high frequency circuit board made from alumina mounted on a copper (Cu) base plate.

In order to avoid the crack of the alumina substrate, a laminated structure of molybdenum (Mo) and Cu is used, but Mo layer has prevented heat conduction.

Although it is also used as a structure of forming the whole base by a metallic body with the thermal expansion coefficient near that of alumina, such as Mo, and embedding Cu only directly under the semiconductor which is an exothermic unit, a dedicated package must be produced according to the mounting position of the heating element.

In order to control the warping, it is also proposed about a structure which improves a design flexibility both of linear thermal expansion and Young's modulus by increasing the number of laminated layers and fine-tuning to the thickness of each layer finely. However, since there are many numbers of layers, the thickness of each layer is different, and there is a rule also in laminating order, it is easy to occur the mistake at the time of production. Also, according to a system which fine-tunes to the thickness of each layer of multilayered lamination finely, and maintains the warping amount and balance, it is difficult to control the production since there are many parts and products.

In order to avoid the crack of the alumina substrate, a compound material of Mo and Cu is used. The design flexibility of linear thermal expansion and Young's modulus is improved by fine-tuning to the mixing ratio finely. According to the above-mentioned compound material, it is easy to control the production, because of mixing the materials at a material stage. However, a heat conductivity of the compound material is low compared with a pure metal, thereby preventing the heat conduction.

BRIEF DESCRIPTION OF THE DRAWINGS

FIG. 1B is a schematic bird's-eye view for explaining the package utilized for a high frequency semiconductor device according to the first embodiment, and shows a schematic configuration of a metal seal ring 14a.

FIG. 3A shows a schematic cross-section structure of the package utilized for a high frequency semiconductor device according to the first embodiment taken in the line I-I of FIG. 2.

FIG. 3B shows a schematic cross-section structure showing warping of a layered structure composed both of the CTE control layer 40 and the heat conduction layer 50.

FIG. 4 shows a package utilized for a high frequency semiconductor device according to a second embodiment, and shows a schematic cross-section structure taken in the line I-I of FIG. 2.

DETAILED DESCRIPTION

Figure 1A:
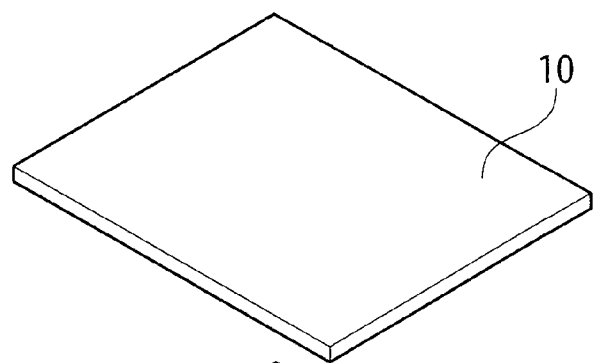
FIG. 1A is a schematic bird's-eye view for explaining a package utilized for a high frequency semiconductor device according to a first embodiment, and shows a schematic configuration of a metal cap 10.
Figure 1B:
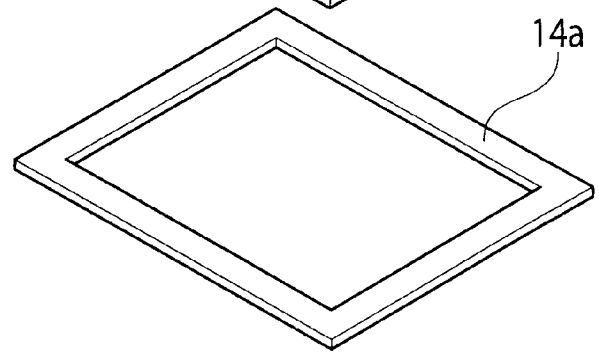
Figure 1C:
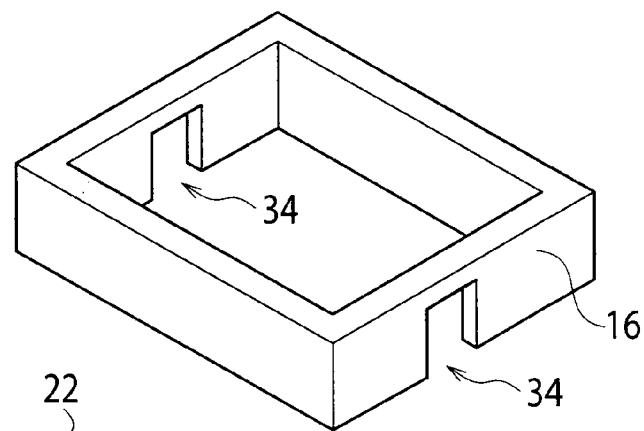
FIG. 1C is a schematic bird's-eye view for explaining the package utilized for a high frequency semiconductor device according to the first embodiment, and shows a schematic configuration of a metal wall 16.
Figure 1D:
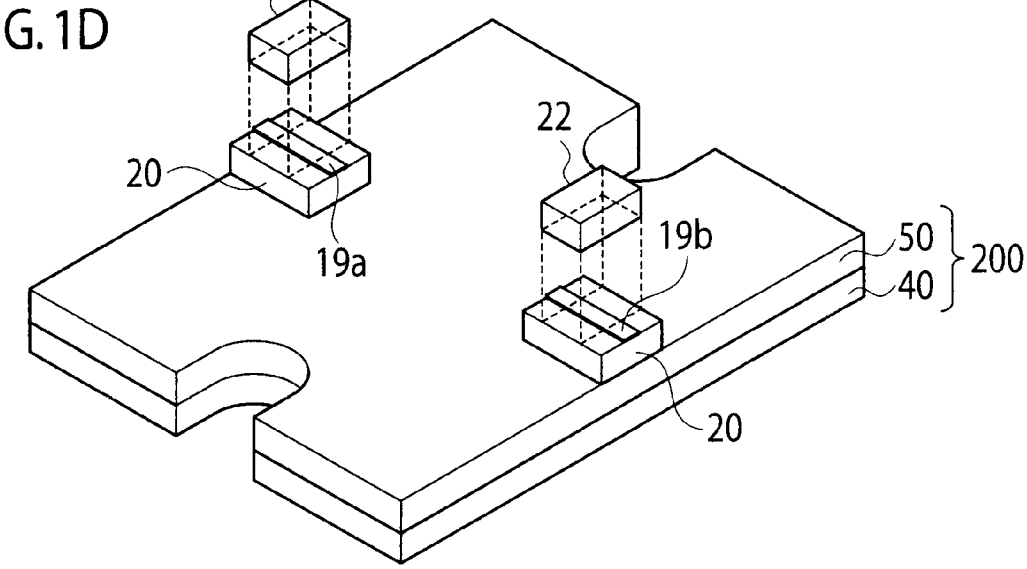
FIG. 1D is a schematic bird's-eye view for explaining the package utilized for a high frequency semiconductor device according to the first embodiment, and shows a schematic configuration of a conductive base plate 200 composed both of a CTE (coefficient of thermal expansion) control layer 40 and a heat conduction layer 50, a lower layer feed through 20, an upper layer feed through 22, and an input stripline 19a and an output stripline 19b disposed on the lower layer feed through 20.

Next, embodiments will be described with reference to drawings.

According to one embodiment, a package utilized for a high frequency semiconductor device includes a conductive base plate. The conductive base plate includes a CTE control layer composed of compound material, and a heat conduction layer disposed on the CTE control layer and composed of Cu.

First Embodiment (Structure of Package Utilized for High Frequency Semiconductor Device)

FIG. 1 shows a schematic bird's-eye view configuration for explaining a package utilized for a high frequency semiconductor device 1 according to a first embodiment. FIG. 1A shows a schematic configuration of a metal cap 10, FIG. 1B shows a schematic configuration of a metal seal ring 14a, FIG. 1C shows a schematic configuration of a metal wall 16, and FIG. 1D shows a schematic configuration of a conductive base plate 200 composed both of a CTE control layer 40 and a heat conduction layer 50, a lower layer feed through 20, an upper layer feed through 22, and an input stripline 19a and an output stripline 19b disposed on the lower layer feed through 20, respectively.

As shown in FIG. 1, the package utilized for a high frequency semiconductor device 1 according to the first embodiment includes: the conductive base plate 200 composed both of the CTE control layer 40 and the heat conduction layer 50; the lower layer feed through 20 disposed on the conductive base plate 200; the upper layer feed through 22 disposed on the lower layer feed through 20; the input stripline 19a and the output stripline 19b which are disposed on the lower layer feed through 20; the metal wall 16 disposed on the conductive base plate 200; the metal seal ring 14a disposed on the metal wall 16; and the metal cap 10 disposed on the metal seal ring 14a.

(Plane Pattern Configuration)

Figure 2:
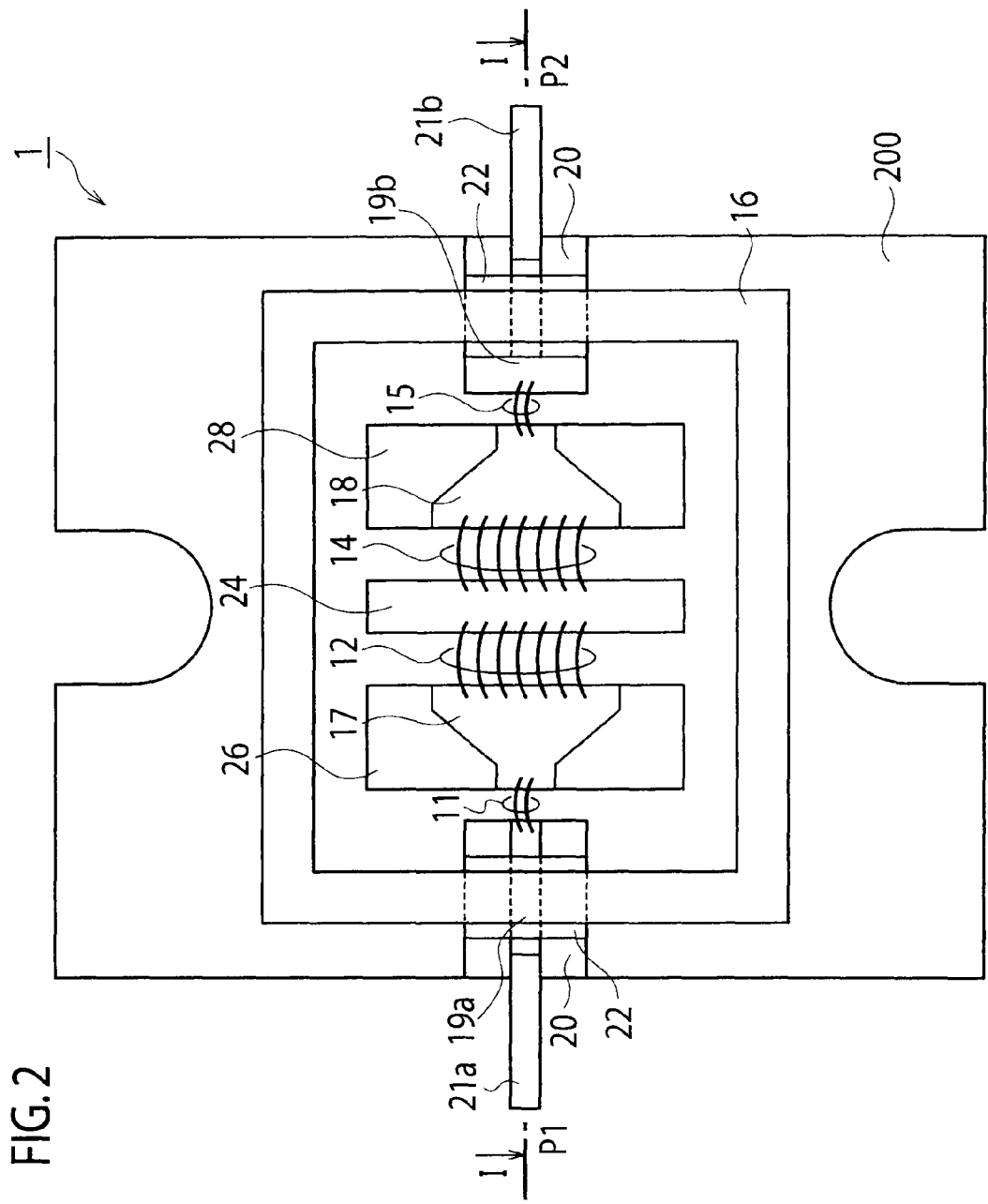
FIG. 2 shows a schematic planar pattern configuration of the package utilized for a high frequency semiconductor device according to the first embodiment.

A schematic planar pattern configuration of the package utilized for a high frequency semiconductor device 1 according to the first embodiment is expressed as shown in FIG. 2. Also, a schematic cross-section structure taken in the line I-I of FIG. 2 is expressed as shown in FIG. 3.

As shown in FIG. 2, the package utilized for a high frequency semiconductor device 1 according to the first embodiment includes: a semiconductor device 24 disposed on the conductive base plate 200; the metal wall 16 which is disposed on the conductive base plate 200 to house the semiconductor device 24; a through-hole 34 (refer to FIG. 1C) disposed in the input and output units of the metal wall 16; the lower layer feed through 20 inserted into the through-hole 34 and disposed on the conductive base plate 200; the upper layer feed through 22 inserted into the through-hole 34 and disposed on the lower layer feed through 20; the input stripline 19a disposed on the lower layer feed through 20 in the input unit of the metal wall 16; and the output stripline 19b disposed on the lower layer feed through 20 in the output unit of the metal wall 16.

Moreover, as shown in FIG. 2, a terminal electrode 21a acting as an input terminal P1, and a terminal electrode 21b acting as an output terminal P2 are connected to the input stripline 19a and the output stripline 19b, respectively.

Moreover, as shown in FIG. 1 and FIG. 3, the metal cap 10 is disposed on the metal wall 16 via the metal seal ring 14a, but the illustrating is omitted in FIG. 2.

Moreover, the lower layer feed through 20 can be formed of the same material as the metal wall 16, for example, alumina, ($Al_2O_3$), alumimium nitride (AlN), beryllium oxide (BeO), etc.

Moreover, as shown in FIG. 2, the package utilized for a high frequency semiconductor device 1 according to the first embodiment may include: an input circuit substrate 26 and an output circuit substrate 28 which are disposed, to adjoin of the semiconductor device 24, on the conductive base plate 200 surrounded by the metal wall 16; an input matching circuit 17 which is disposed on the input circuit substrate 26 and is connected to the input stripline 19a; an output matching circuit 18 which is disposed on the output circuit substrate 28 and is connected to the output stripline 19b; a bonding wire 12 which connects between the semiconductor device 24 and the input matching circuit 17; and a bonding wire 14 which connects between the semiconductor device 24 and the output matching circuit 18.

Moreover, the package utilized for a high frequency semiconductor device 1 according to the first embodiment may include: a bonding wire 11 which connects between the input stripline 19a and the input matching circuit 17; and a bonding wire 15 which connects between the output stripline 19b and the output matching circuit 18.

Moreover, as shown in FIG. 3, the package utilized for a high frequency semiconductor device 1 according to the first embodiment may include: the metal seal ring 14a disposed on the metal wall 16; and the metal cap 10 disposed on the metal seal ring 14a.

(Conductive Base Plate 200)

A schematic cross-section structure of the package utilized for a high frequency semiconductor device according to the first embodiment taken in the line I-I of FIG. 2 is expressed as shown in FIG. 3A, and a schematic cross-section structure showing the warping of a layered structure composed both of the CTE control layer 40 and the heat conduction layer 50 is expressed as shown in FIG. 3B.

The package utilized for a high frequency semiconductor device according to the first embodiment includes: the CTE control layer 40 composed of compound material, and the conductive base plate 200 including the heat conduction layer 50 which is disposed on the CTE control layer 40 and is composed of Cu.

As shown in FIG. 3B, the conductive base plate 200 (not shown in FIG. 3A) has the warping amount t, in detail. The value of the warping amount t is about 1 μm to 5 μm, for example. Also, as shown in FIG. 3B, the warping direction of the conductive base plate 200 is the direction to form a convex against the bottom surface direction opposed to a mounting surface of the semiconductor device 24, the input circuit substrate 26, or the output circuit substrate 28, etc. This is because of the following reason. The linear thermal expansion coefficient of Cu is $16.8 \times 10^{-6}$/K, for example. On the other hand, the linear thermal expansion coefficient of the compound material of Cu and Mo of the CTE control layer 40 is $7.0 \times 10^{-6}$/K to $13.0 \times 10^{-6}$/K, for example, and is smaller than that of Cu. Therefore, when the semiconductor device 24, the input circuit substrate 26, the output circuit substrate 28, etc. are cooled after bonding (mounting) at high temperature, such as soldering, on the mounting surface of the heat conduction layer 50 composed of Cu, the heat conduction layer 50 composed of Cu warps in warping amount t in the direction to form a convex against the bottom surface direction opposite to the mounting surface of the semiconductor device 24, the input circuit substrate 26, and the output circuit substrate 28, etc., as shown in FIG. 3B.

As the compound material to form the CTE control layer 40 herein, an applicable compound is any one of a compound of Cu and Mo, a compound of Cu and W, a compound of Al and Mo or a compound of Al and W, for example.

Although the warping amount t is changed also by mounting alumina ($Al_2O_3$), such as the metal wall 16 or the input circuit substrate 26 and the output circuit substrate 28, etc., the warping amount t can be adjusted by adjusting the compound ratio of the compound material which composes the CTE control layer 40, and the thickness of the CTE control layer 40.

The design flexibility both of the linear thermal expansion and the Young's modulus of the conductive base plate 200 can be improved by composing the CTE control layer 40 from the compound material of Cu and Mo, for example, and fine-tuning to the mixing ratio finely.

The thickness of the CTE control layer 40 is about 0.4 mm to about 0.8 mm, for example.

For example, the compound mixing ratio of the CTE control layer 40 composed of the compound material of Cu and Mo is Cu/Mo=about 20%/80% to about 80%/20%. Moreover, the compound mixing ratio within the CTE control layer 40 may be distributed over the thickness direction. Still more satisfactory heat radiation characteristics can be secured, for example, by increasing the mixing ratio of Cu in the direction near the heat conduction layer 50, and increasing the mixing ratio of Mo in the direction away from heat conduction layer 50.

Moreover, the thickness of the heat conduction layer 50 composed of Cu is also about 0.4 mm to about 0.8 mm, for example.

In addition, electroplated conductors, such as Au, Ni, Ag, an Ag—Pt alloy and an Ag—Pd alloy, may be formed on the surface of the conductive base plate 200, for example.

The heat conduction layer 50 is preferable for thermal conductivity to be high in order to secure heat diffusibility.

In the package utilized for a high frequency semiconductor device 1 according to the first embodiment, the conductive base plate 200 may further include a contact thermal resistance reducing layer 70 disposed on the bottom surface of the CTE control layer 40 to oppose to the heat conduction layer 50.

The contact thermal resistance reducing layer 70 can be formed of Cu having the thickness thinner than the thickness of the heat conduction layer 50, for example. The thickness of the contact thermal resistance reducing layer 70 formed of thin Cu is about 0.1 mm to about 0.4 mm, for example.

The contact thermal resistance reducing layer 70 is a layer which acts as reducing the contact thermal resistance between a heat sink to mount the conductive base plate 200 and the contact thermal resistance reducing layer 70, and it is preferable not to interfere the down warping of the conductive base plate 200. Therefore, the contact thermal resistance reducing layer 70 is relatively formed as a thin layer compared with the heat conduction layer 50 or the CTE control layer 40.

Moreover, the heat conduction coefficient of Mo is 138 W/m·K in contrast to the heat conduction coefficients of Cu being about 401 W/m·K. Accordingly, the heat conduction is obstructed in the laminated structure which sandwiches the Mo layer by the Cu layer. On the other hand, as shown in FIG. 3, the warping amount of the conductive base plate 200 can be fine-tuned by securing a satisfactory radiation characteristic by the heat conduction layer 50, and adjusting the compound ratio or the thickness of the CTE control layer 40, according to the package utilized for a high frequency semiconductor device 1 according to the first embodiment including the conductive base plate 200 formed of the layered structure both of the CTE control layer 40 composed of the compound material including Mo near the thermal expansion coefficient of alumina, and the heat conduction layer 50 disposed on the CTE control layer 40 and acting as a packaging surface of the semiconductor device 24.

(Metal Wall 16)

The metal wall 16 is formed of conductive metals, such as aluminum, copper, molybdenum, tungsten, a copper molybdenum alloy, and a copper tungsten alloy, for example.

A solder metal layer (not shown) for soldering is formed on the top surface of the metal wall 16 via the metal seal ring 14a. The solder metal layer can be formed of Au—Ge, Au—Sn, etc., for example.

(Metal Cap 10)

The metal cap 10 has a flat plate shape as shown in FIG. 1. The metal cap 10 is formed of conductive metals, such as aluminum, molybdenum, and a copper molybdenum alloy, for example.

Moreover, the lower layer feed through 20 and the upper layer feed through 22 may be formed of the same material, such as ceramics, for example. The material of ceramics can be formed of alumina ($Al_2O_3$), aluminium nitride (AlN), beryllium oxide (BeO), etc., for example.

The package utilized for a high frequency semiconductor device according to the first embodiment has the high frequency characteristic of not less than 3 GHz. Accordingly, the package utilized for a high frequency semiconductor device according to the first embodiment is applicable as a device and a package for component parts having high frequency (that is, frequency over 3 GHz).

(Fabrication Method of Package Utilized for High Frequency Semiconductor Device)

As shown in FIG. 1, FIG. 2, and FIG. 3, the fabrication method of the package utilized for a high frequency semiconductor device 1 according to the first embodiment includes the step of forming the conductive base plate 200 including the step of forming the CTE control layer 40 composed of compound material and the step of forming the heat conduction layer 50 composed of Cu on the CTE control layer 40.

The step of forming the conductive base plate 200 may have further the step of forming the contact thermal resistance reducing layer 70 to oppose to the heat conduction layer 50, on the bottom surface of the CTE control layer 40.

As shown in FIG. 1, FIG. 2, and FIG. 3, the fabrication method of the package utilized for a high frequency semiconductor device 1 according to the first embodiment may include: the step of forming the semiconductor device 24 on the conductive base plate 200 formed by the above-mentioned steps; the step of forming the metal wall 16 on the conductive base plate 200 to house the semiconductor device 24; the step of forming the through-hole 34 in the input and output units of the metal wall 16; the step of forming the lower layer feed through 20 on the conductive base plate 200 so as to be inserted into the through-hole 34; the step of forming the upper layer feed through 22 on the lower layer feed through 20 so as to be inserted into the through-hole 34; the step of forming the input stripline 19a on the lower layer feed through 20, in the input unit of the metal wall 16; and the step of forming the output stripline 19b on the lower layer feed through 20, in the output unit of the metal wall 16.

Furthermore, as shown in FIG. 1, FIG. 2, and FIG. 3, the fabrication method of the package utilized for a high frequency semiconductor device 1 according to the first embodiment may also include: the step of forming the input circuit substrate 26 and the output circuit substrate 28, to adjoin of the semiconductor device 24, on the conductive base plate 200 surrounded by the metal wall 16; the step of forming the input matching circuit 17 connected to the input stripline 19a on the input circuit substrate 26; the step of forming the output matching circuit 18 connected to the output stripline 19b on the output circuit substrate 28; the step of forming the bonding wire 12 which connects between the input matching circuit 17 and the semiconductor device 24; and the step of forming the bonding wire 14 which connects between the output matching circuit 18 and the semiconductor device 24.

Furthermore, as shown in FIG. 2 and FIG. 3, the fabrication method of the package utilized for a high frequency semiconductor device 1 according to the first embodiment may also include: the step of forming the bonding wire 11 which connects between the input matching circuit 17 and the input stripline 19a; and the step of forming the bonding wire 15 which connects between the output matching circuit 18 and the output stripline 19b.

Furthermore, as shown in FIG. 1 and FIG. 3, the fabrication method of the package utilized for a high frequency semiconductor device 1 according to the first embodiment may also include: the step of forming the metal seal ring 14a on the metal wall 16; and the step of forming the metal cap 10 on the metal seal ring 14a.

In the semiconductor package according to the first embodiment, the heat conduction layer 50 acting as the semiconductor packaging surface has the highest thermal density, since the conductive base plate 200 includes the CTE control layer 40 composed of metal (for example, compound material of Mo and Cu) near the linear thermal expansion rate of alumina, and the heat conduction layer 50 disposed on the CTE control layer 40 and composed of Cu. Accordingly, the heat conduction layer 50 acting as the semiconductor packaging surface can diffuse heat by forming of Cu having high thermal conductivity. The influence of the heat conductivity of the layers being low, not over the CTE control layer 40, can be reduced by conducting the heat over the wide size.

According to the package for a semiconductor device according to the first embodiment, the warping amount can also be fine-tuned finely, since the design flexibility both of the linear thermal expansion and Young's modulus can be improved by fine-tuning to the compound mixing ratio of the CTE control layer composed of the compound material, in addition to the above-mentioned heat radiation characteristics.

Second Embodiment

A planar pattern configuration of a package utilized for a high frequency semiconductor device 1 according to a second embodiment is similarly expressed as shown in FIG. 2. Accordingly, FIG. 4 shows a schematic cross-section structure of the package utilized for a high frequency semiconductor device 1 according to the second embodiment taken in the line II-II of FIG. 2.

In the package utilized for a high frequency semiconductor device 1 according to the second embodiment, as shown in FIG. 4, the conductive base plate 200 includes a thermal diffusion layer 60 which intervenes between the heat conduction layer 50 and the CTE control layer 40.

The thermal diffusion layer 60 can be formed of any one of a compound of a carbon fiber and Cu, a compound of a carbon fiber and Al, the compound of a diamond and Cu, or a compound of a diamond and Al, for example.

The thermal diffusion layer 60 is preferable for the heat diffusibility to be satisfactory. Duplicating explanation is omitted since other configurations are the same as that of the first embodiment.

As shown in FIG. 4, it is only different in that the fabrication method of the package utilized for a high frequency semiconductor device according to the second embodiment includes the step of forming the thermal diffusion layer 60 between the heat conduction layer 50 and the CTE control layer 40, in the step of forming the conductive base plate 200. Therefore, duplicating explanation is omitted since other steps are the same as that of the fabrication method of the package utilized for a high frequency semiconductor device according to the first embodiment.

According to the second embodiment, the radiation characteristic can be further satisfactory compared with the first embodiment, since the thermal diffusion layer 60 is disposed between the heat conduction layer 50 and the CTE control layer 40.

In the semiconductor package according to the second embodiment, the conductive base plate 200 includes the CTE control layer 40 composed of the compound material both of Cu and Mo, for example, the thermal diffusion layer 60 which is disposed on the CTE control layer 40 and is composed of the compound material both of the carbon fiber and Al, for example, and the heat conduction layer 50 which is disposed on the thermal diffusion layer 60 and is composed of Cu. Accordingly, the heat conducted from the heat conduction layer 50 composed of Cu is diffused by the thermal diffusion layer 60, the heat is conducted over the wider bonded area, and thereby the influence on the heat conductivity of the layers not over the CTE control layer 40 being low can be reduced.

The thermal diffusion layer 60 is a compound of the carbon fiber and Al, for example, the heat conduction coefficient in the planar direction is 700 mW/m·K to 800 mW/m·K, for example, and the thermal diffusion layer 60 has severalfold height compared with the height of Cu. However, since the heat conduction coefficient in the board thickness direction is 300 mW/m·K and is lower than that of Cu, it is preferable that the thickness is thin as being 0.1 mm to 0.2 mm.

The thermal diffusion layer 60 does not necessarily be preferable to warp in the direction to form the convex against the top surface direction of the mounting surface side, since the thermal diffusion layer 60 is a compound of the carbon fiber and Al, for example, and the linear thermal expansion coefficient is $5.0 \times 10^{-6}$/K to $9.0 \times 10^{-6}$/K, for example, and also is lower than that of Cu. However, the warping amount can also be fine-tuned since the design flexibility both of the linear thermal expansion and the Young's modulus can be improved by adjusting the compound mixing ratio of the CTE control layer composed of the compound material.

Third Embodiment

A planar pattern configuration of a package utilized for a high frequency semiconductor device 1 according to a third embodiment is similarly expressed as shown in FIG. 2. Accordingly, FIG. 5 shows a schematic cross-section structure of the package utilized for a high frequency semiconductor device 1 according to the third embodiment taken in the line II-II of FIG. 2.

Figure 5:
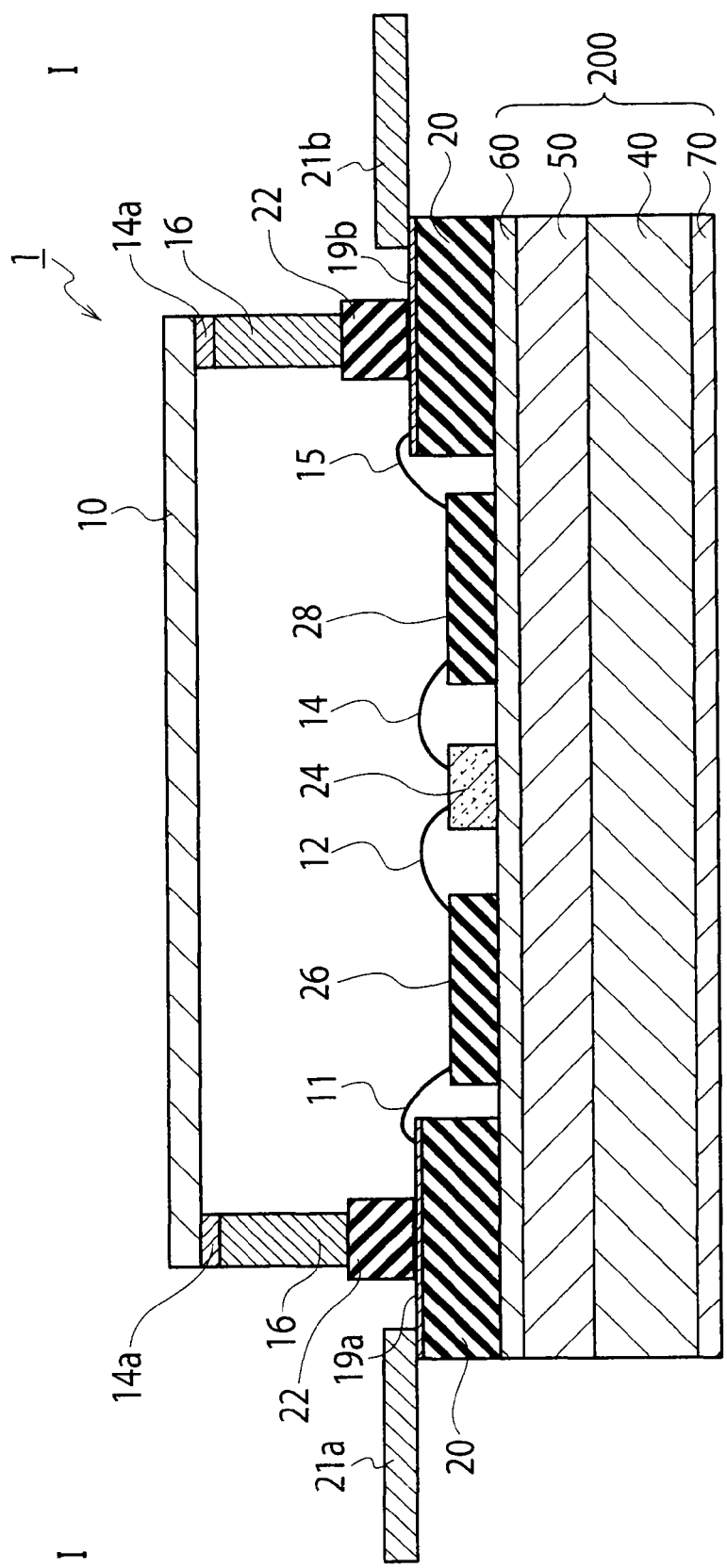
FIG. 5 shows a package utilized for a high frequency semiconductor device according to a third embodiment, and shows a schematic cross-section structure taken in the line I-I of FIG. 2.

In the package utilized for a high frequency semiconductor device 1 according to the third embodiment, as shown in FIG. 5, the conductive base plate 200 includes a thermal diffusion layer 60 disposed on the heat conduction layer 50.

The thermal diffusion layer 60 can be formed of any one of a compound of a carbon fiber and Cu, a compound of a carbon fiber and Al, the compound of a diamond and Cu, or a compound of a diamond and Al, for example. Duplicating explanation is omitted since other configurations are the same as that of the first embodiment.

The thermal diffusion layer 60 is preferable for the heat diffusibility to be satisfactory.

As shown in FIG. 5, it is only different in that the step of forming the conductive base plate 200 includes the step of forming the thermal diffusion layer 60 on the heat conduction layer 50. Therefore, duplicating explanation is omitted since other steps are the same as that of the fabrication method of the package utilized for a high frequency semiconductor device according to the first embodiment.

According to the third embodiment, the radiation characteristic can be further satisfactory compared with the first embodiment since the package utilized for a high frequency semiconductor device 1 includes the CTE control layer 40, the heat conduction layer 50 disposed on the CTE control layer 40, and the thermal diffusion layer 60 disposed on the heat conduction layer 50.

In the semiconductor package according to the third embodiment, the conductive base plate 200 includes the CTE control layer 40 composed of a compound material of Cu and Mo, for example, the heat conduction layer 50 disposed on the CTE control layer 40 and composed of the compound material of the carbon fiber and Al, for example, and the thermal diffusion layer 60 disposed on the heat conduction layer 50 and composed of Cu. Accordingly, the heat conducted from the thermal diffusion layer 60 is diffused by the heat conduction layer 50, the heat is conducted over the wider bonded area, and thereby the influence on the heat conductivity of the layers not over the CTE control layer 40 being low can be reduced.

The thermal diffusion layer 60 is a compound of the carbon fiber and Al, for example, the heat conduction coefficient in the planar direction is 700 mW/m·K to 800 mW/m·K, for example, and the thermal diffusion layer 60 has severalfold height compared with the height of Cu. However, since the heat conduction coefficient in the board thickness direction is 300 mW/m·K and is lower than that of Cu, it is preferable that the thickness is thin as being 0.1 mm to 0.2 mm.

The thermal diffusion layer 60 does not necessarily be preferable to warp in the direction to form the convex against the top surface direction of the mounting surface side since the thermal diffusion layer 60 is a compound of the carbon fiber and Al, for example, and the linear thermal expansion coefficient is $5.0 \times 10^{-6}$/K to $9.0 \times 10^{-6}$/K, for example, and also is lower than that of Cu. However, the warping amount can also be fine-tuned since the design flexibility both of the linear thermal expansion and the Young's modulus can be improved by adjusting the compound mixing ratio of the CTE control layer composed of the compound material.

Fourth Embodiment

A planar pattern configuration of a package utilized for a high frequency semiconductor device 1 according to a fourth embodiment is similarly expressed as shown in FIG. 2. Accordingly, FIG. 6 shows a schematic cross-section structure of the package utilized for a high frequency semiconductor device 1 according to the fourth embodiment taken in the line II-II of FIG. 2.

Figure 6:
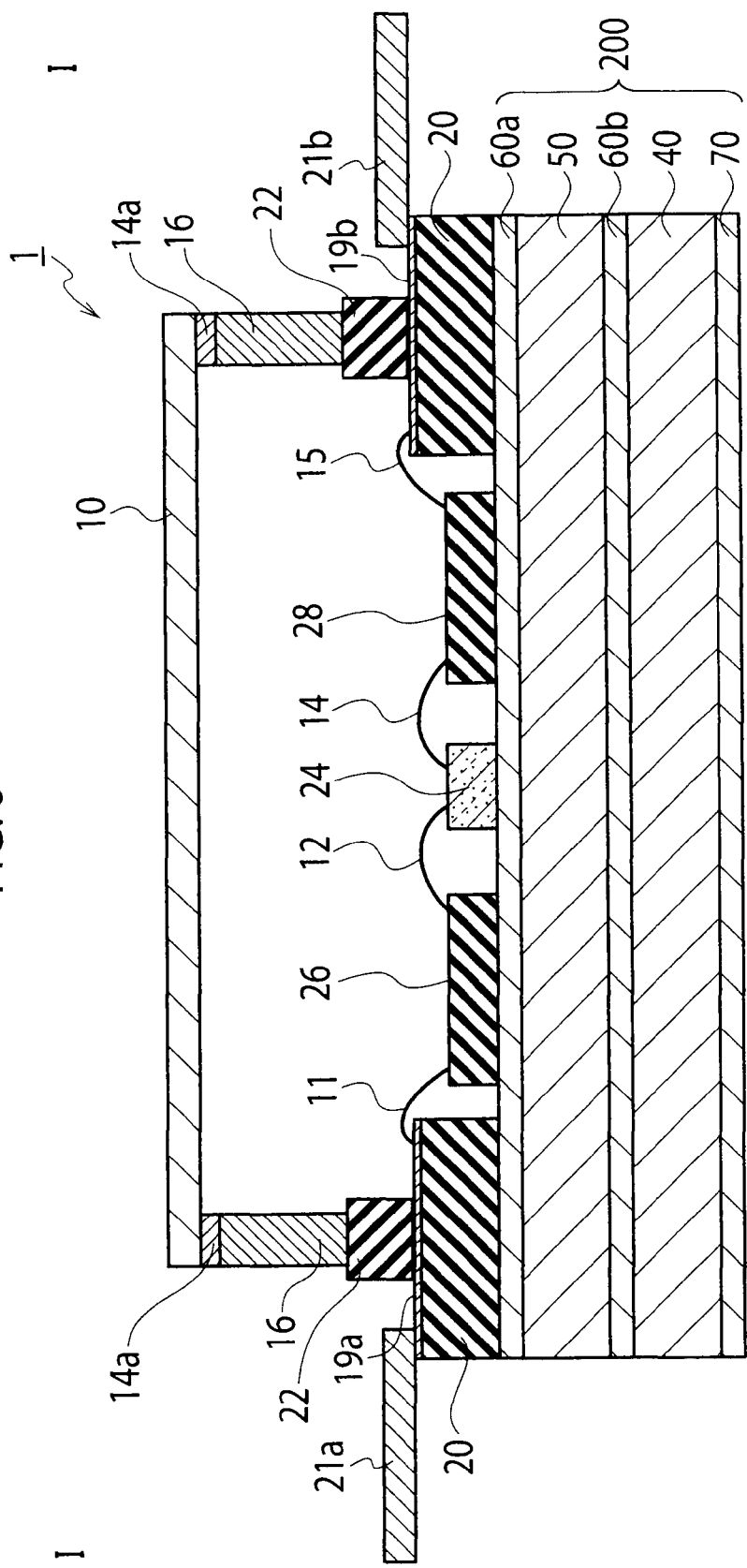
FIG. 6 shows a package utilized for a high frequency semiconductor device according to a fourth embodiment, and shows a schematic cross-section structure taken in the line I-I of FIG. 2.

In the package utilized for a high frequency semiconductor device 1 according to the fourth embodiment, as shown in FIG. 6, the conductive base plate 200 includes a first thermal diffusion layer 60a disposed on the heat conduction layer 50, and a second thermal diffusion layer 60b which intervenes between the heat conduction layer 50 and the CTE control layer 40.

The first and second thermal diffusion layers 60a and 60b can be formed of any one of a compound of a carbon fiber and Cu, a compound of a carbon fiber and Al, the compound of a diamond and Cu, or a compound of a diamond and Al, for example. Duplicating explanation is omitted since other configurations are the same as that of the first embodiment.

The first and second thermal diffusion layers 60a and 60b are preferable for the heat diffusibility to be satisfactory.

As shown in FIG. 6, in the step of forming the conductive base plate 200, it is only different in that the fabrication method of the package utilized for a high frequency semiconductor device according to the fourth embodiment includes the step of forming the first thermal diffusion layer 60a on the heat conduction layer 50, and the step of forming the second thermal diffusion layer 60b between the heat conduction layer 50 and the CTE control layer 40. Therefore, duplicating explanation is omitted since other steps are the same as that of the fabrication method of the package utilized for a high frequency semiconductor device according to the first embodiment.

According to the fourth embodiment, the package utilized for a high frequency semiconductor device 1 includes the CTE control layer 40, the second thermal diffusion layer 60b disposed on the CTE control layer 40, the heat conduction layer 50 disposed on the second thermal diffusion layer 60b, and the first thermal diffusion layer 60a disposed on the heat conduction layer 50. Therefore, the radiation characteristic can be further satisfactory compared with the first to third embodiment.

In the semiconductor package according to the fourth embodiment, the conductive base plate 200 includes the CTE control layer 40 composed of the compound material of Cu and Mo, for example, the second thermal diffusion layer 60b disposed on the CTE control layer 40 and composed of the compound material of the carbon fiber and Al, for example, the heat conduction layer 50 disposed on the second thermal diffusion layer 60b and composed of Cu, and the first thermal diffusion layer 60a disposed on the heat conduction layer 50 and composed of the compound material of the carbon fiber and Al, for example. Accordingly, the heat conducted from the first thermal diffusion layer 60a and the heat conduction layer 50 is diffused by the second thermal diffusion layer 60b, the heat is conducted over the wider bonded area, and thereby the influence on the heat conductivity of the layers not over the CTE control layer 40 being low can be reduced.

Each the first and second thermal diffusion layers 60a and 60b is a compound of the carbon fiber and Al, for example, the heat conduction coefficient in the planar direction is 700 mW/m·K to 800 mW/m·K, for example, and the thermal diffusion layer 60 has severalfold height compared with the height of Cu. However, since the heat conduction coefficient in the board thickness direction is 300 mW/m·K and is lower than that of Cu, it is preferable that the thickness is thin as being 0.1 mm to 0.2 mm.

Each the first and second thermal diffusion layers 60a and 60b does not necessarily be preferable to warp in the direction to form the convex against the top surface direction of the mounting surface side since each the first and second thermal diffusion layers 60a and 60b is a compound of the carbon fiber and Al, for example, and the linear thermal expansion coefficient is $5.0 \times 10^{-6}$/K to $9.0 \times 10^{-6}$/K, for example, and also is lower than that of Cu. However, the warping amount can also be fine-tuned since the design flexibility both of the linear thermal expansion and the Young's modulus can be improved by adjusting the compound mixing ratio of the CTE control layer composed of the compound material.

(Configuration of Semiconductor Device)

Figure 7A:
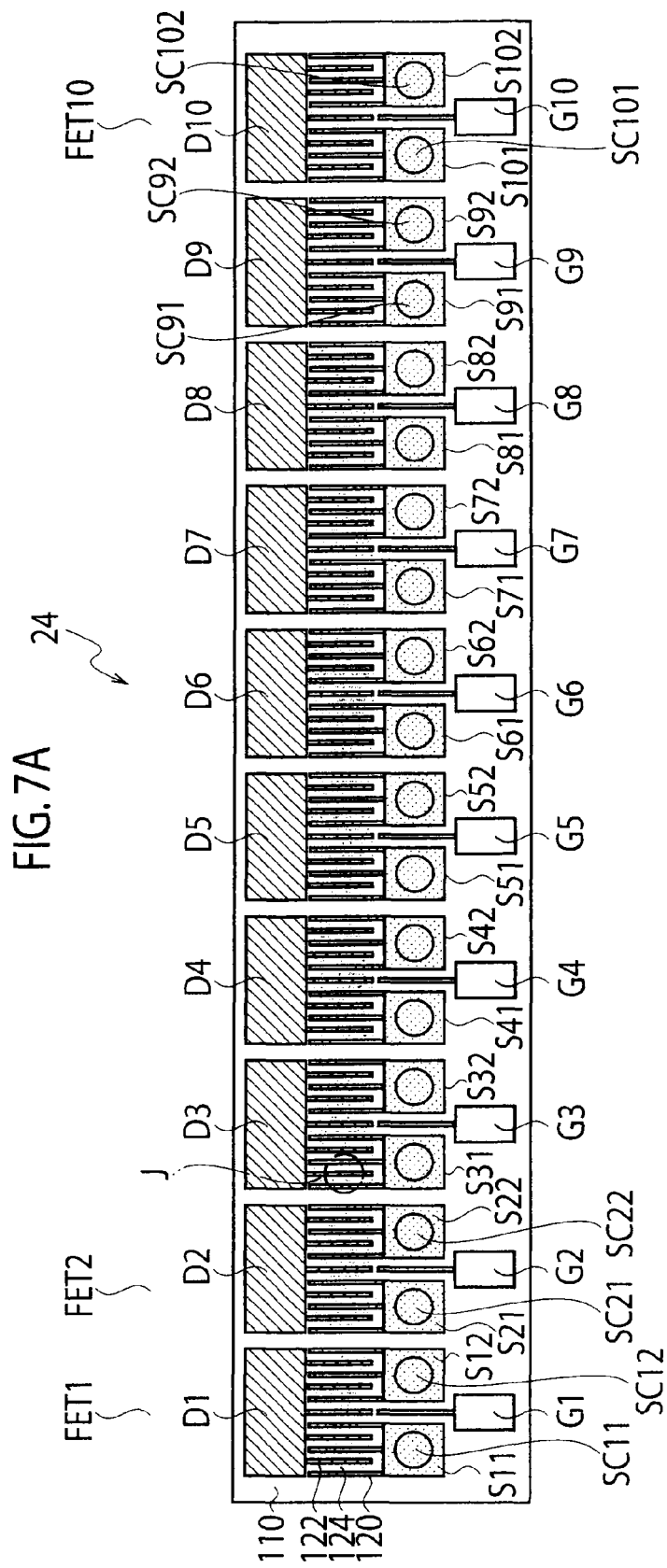
FIG. 7A shows an enlarged drawing of a schematic planar pattern configuration of a semiconductor device applicable to the package utilized for a high frequency semiconductor device according to the first to fourth embodiment.
Figure 7B:
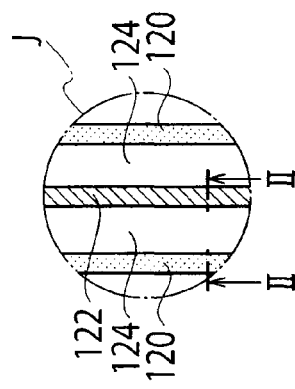
FIG. 7B is an enlarged drawing of a part J of FIG. 7A.

An enlarged drawing of a schematic planar pattern configuration of the semiconductor device 24 which can be mounted on the package utilized for a high frequency semiconductor device according to the first to fourth embodiment is expressed as shown in FIG. 7A, and an enlarged drawing of a part J of FIG. 7A is expressed as shown in FIG. 7B. Also, configuration examples 1-4 of the semiconductor device 24 which can be mounted on the package utilized for a high frequency semiconductor device according to the first to fourth embodiment, and schematic cross section configuration examples 1-4 taken in the line II-II of FIG. 7B are expressed as shown in FIG. 8 to FIG. 12, respectively.

In the semiconductor device 24 which can be mounted in the package utilized for a high frequency semiconductor device according to the first to fourth embodiment, as shown in FIG. 7 to FIG. 11, a plurality of FET cells FET 1 to FET 10 include: a semi-insulating substrate 110; a gate finger electrode 124, a source finger electrode 120, and a drain finger electrode 122 which are disposed on a first surface of the semi-insulating substrate 110, and have a plurality of fingers, respectively; a plurality of gate terminal electrodes G1, G2, ..., G10, a plurality of source terminal electrodes S11, S12, S21, S22, ..., S101, and S102 and the drain terminal electrodes D1, D2, ..., D10 which are disposed on the first surface of the semi-insulating substrate 110, and ties a plurality of fingers, respectively every the gate finger electrode 124, the source finger electrode 120, and the drain finger electrode 122; VIA holes SC11, SC12, SC21, SC22, ..., SC101, and SC102 disposed at the lower part of the source terminal electrodes S11, S12, S21, S22, ..., S101, and S102; and a ground electrode (not shown) which is disposed on a second surface of the opposite side of a first surface of the semi-insulating substrate 110, and is connected via the VIA holes SC11, SC12, SC21, SC22, ..., SC101, and SC102 to the source terminal electrodes S11, S12, S21, S22, ..., S101, and S102.

The bonding wire 12 is connected to the gate terminal electrodes G1, G2, ..., G10; the bonding wire 14 is connected to the drain terminal electrodes D1, D2, ..., D10; the VIA holes SC11, SC12, SC21, SC22, ..., SC101, and SC102 are formed in the lower part of the source terminal electrodes S11, S12, S21, S22, ..., S101, and S102; the barrier metal layers (not shown) formed in the internal wall of the VIA holes SC11, SC12, SC21, SC22, ..., SC101 and SC102; and the source terminal electrode S11, S12, S21, S22, ..., S101, and S102 formed on the barrier metal layers and connected to the ground electrode (not shown) via the filling metal layers (not shown) filled up with the VIA holes.

The semi-insulating substrate 110 is either of a GaAs substrate, an SiC substrate, a GaN substrate, a substrate in which a GaN epitaxial layer is formed on the SiC substrate, a substrate which a heterojunction epitaxial layer composed of GaN/AlGaN is formed on the SiC substrate, a sapphire substrate or a diamond substrate.

CONSTRUCTION EXAMPLE 1

Figure 8:
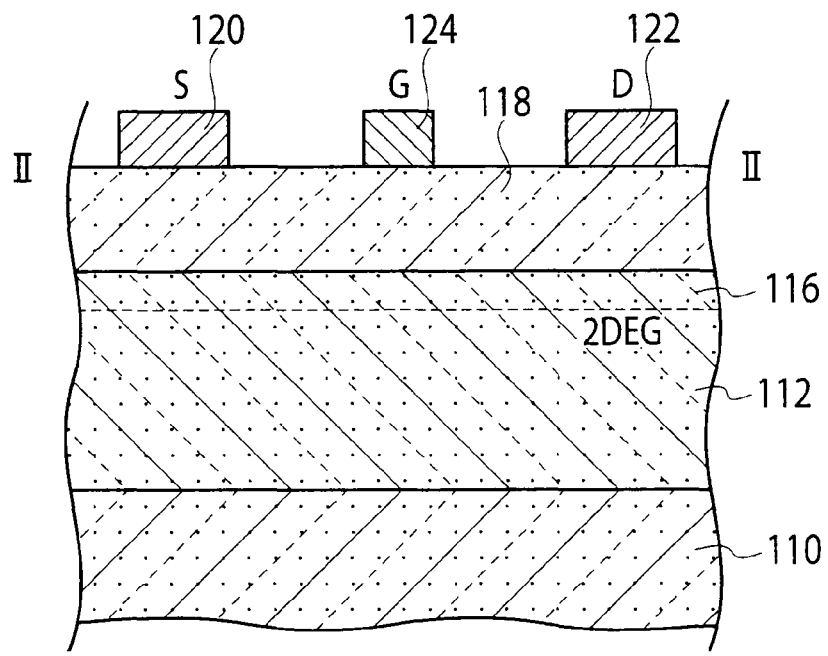
FIG. 8 shows a configuration example 1 of a semiconductor device applicable to the package utilized for a high frequency semiconductor device according to the first to fourth embodiment, and shows a schematic cross-sectional configuration diagram taken in the line II-II of FIG. 7B.

As shown in FIG. 8, a configuration example 1 of an FET cell of the semiconductor device 24 which can be mounted in the package utilized for a high frequency semiconductor device according to the first to fourth embodiment includes: a semi-insulating substrate 110; a nitride based compound semiconductor layer 112 disposed on the semi-insulating substrate 110; an aluminum gallium nitride layer ($Al_xGa_{1-x}N$) (where $0.1<=x<=1$) 118 disposed on the nitride based compound semiconductor layer 112; and a source finger electrode (S) 120, a gate finger electrode (G) 124, and a drain finger electrode (D) 122 which are disposed on the aluminum gallium nitride layer ($Al_xGa_{1-x}N$) (where $0.1<=x<=1$) 118. A two dimensional electron gas (2DEG) layer 116 is formed in the interface between the nitride based compound semiconductor layer 112 and the aluminum gallium nitride layer ($Al_xGa_{1-x}N$) (where $0.1<=x<=1$) 118. FIG. 8 shows a High Electron Mobility Transistor (HEMT) as the constructional example 1.

CONSTRUCTIONAL EXAMPLE 2

Figure 9:
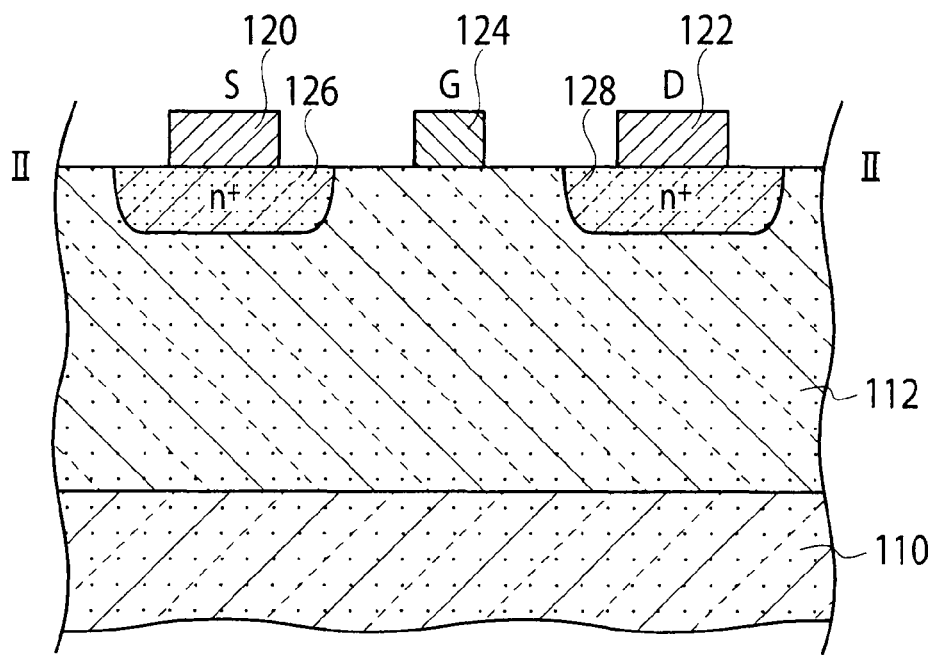
FIG. 9 shows a configuration example 2 of a semiconductor device applicable to the package utilized for a high frequency semiconductor device according to the first to fourth embodiment, and shows a schematic cross-sectional configuration diagram taken in the II-II of FIG. 7B.

As shown in FIG. 9, a constructional example 2 of an FET cell of the semiconductor device 24 which can be mounted in the package utilized for a high frequency semiconductor device according to the first to fourth embodiment includes: a semi-insulating substrate 110; a nitride based compound semiconductor layer 112 disposed on the semi-insulating substrate 110; a source region 126 and a drain region 128 which are disposed on the nitride based compound semiconductor layer 112; and a source finger electrode (S) 120 disposed on the source region 126, a gate finger electrode (G) 124 disposed on the nitride based compound semiconductor layer 112, and a drain finger electrode (D) 122 disposed on the drain region 128. Schottky contact is formed in the interface between the nitride based compound semiconductor layer 112 and the gate finger electrode (G) 124. FIG. 9 shows a Metal Semiconductor Field Effect Transistor (MESFET) as the constructional example 2.

CONSTRUCTIONAL EXAMPLE 3

Figure 10:
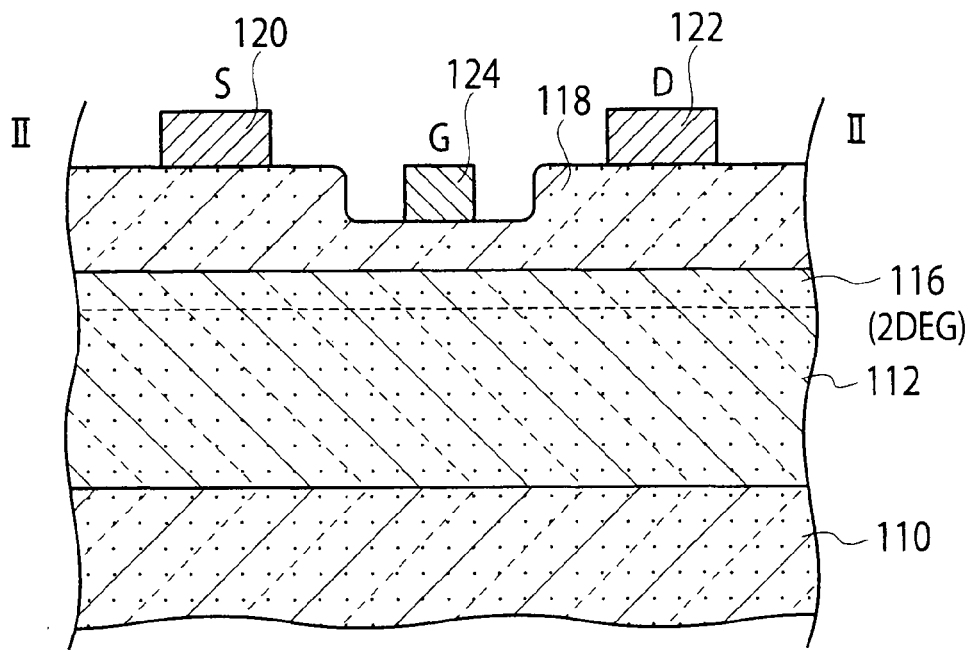
FIG. 10 shows a configuration example 3 of a semiconductor device applicable to the package utilized for a high frequency semiconductor device according to the first to fourth embodiment, and shows a schematic cross-sectional configuration diagram taken in the line II-II of FIG. 7B.

As shown in FIG. 10, a constructional example 3 of an FET cell of the semiconductor device 24 which can be mounted in the package utilized for a high frequency semiconductor device according to the first to fourth embodiment includes: a semi-insulating substrate 110; a nitride based compound semiconductor layer 112 disposed on the semi-insulating substrate 110; an aluminum gallium nitride layer ($Al_xGa_{1-x}N$) (where $0.1<=x<=1$) 118 disposed on the nitride based compound semiconductor layer 112; a source finger electrode (S) 120 and a drain finger electrode (D) 122 which are disposed on the aluminum gallium nitride layer ($Al_xGa_{1-x}N$) (where $0.1<=x<=1$) 118; and a gate finger electrode (G) 124 disposed at a recessed part on the aluminum gallium nitride layer ($Al_xGa_{1-x}N$) (where $0.1<=x<=1$) 118. The 2DEG layer 116 is formed in the interface between the nitride based compound semiconductor layer 112 and the aluminum gallium nitride layer ($Al_xGa_{1-x}N$) (where $0.1<=x<=1$) 118. FIG. 10 shows HEMT as the constructional example 3.

CONSTRUCTIONAL EXAMPLE 4

Figure 11:
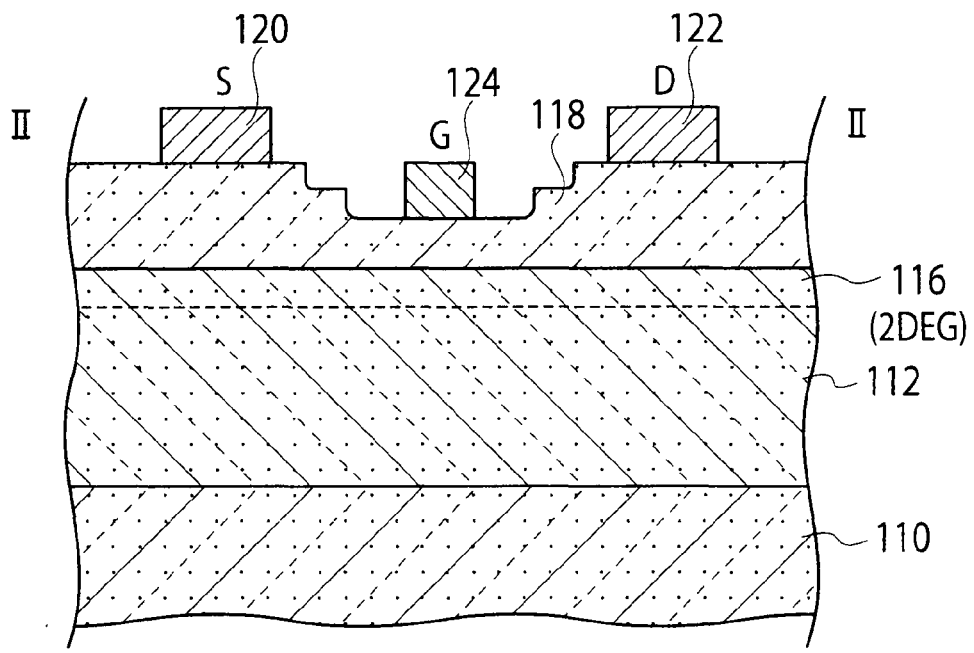
FIG. 11 shows a configuration example 4 of a semiconductor device applicable to the package utilized for a high frequency semiconductor device according to the first to fourth embodiment, and shows a schematic cross-sectional configuration diagram taken in the line II-II of FIG. 7B.

As shown in FIG. 11, a constructional example 4 of an FET cell of the semiconductor device 24 which can be mounted in the package utilized for a high frequency semiconductor device according to the first to fourth embodiment includes: a semi-insulating substrate 110; a nitride based compound semiconductor layer 112 disposed on the semi-insulating substrate 110; an aluminum gallium nitride layer ($Al_xGa_{1-x}N$) (where $0.1<=x<=1$) 118 disposed on the nitride based compound semiconductor layer 112; a source finger electrode (S) 120 and a drain finger electrode (D) 122 which are disposed on the aluminum gallium nitride layer ($Al_xGa_{1-x}N$) (where $0.1<=x<=1$) 118; and a gate finger electrode (G) 124 disposed at a two-step recessed part on the aluminum gallium nitride layer ($Al_xGa_{1-x}N$) (where $0.1<=x<=1$) 118. The 2DEG layer 116 is formed in the interface between the nitride based compound semiconductor layer 112 and the aluminum gallium nitride layer ($Al_xGa_{1-x}N$) (where $0.1<=x<=1$) 118. FIG. 11 shows HEMT as the constructional example 4.

Moreover, in the above-mentioned constructional examples 1-4, the nitride based compound semiconductor layer 112 except an active area is electrically used as an inactivity isolation region. Here, the active area is composed of the source finger electrode 120, the 2DEG layer 116 directly under the gate finger electrode 124 and the drain finger electrode 122, and the 2DEG layer 116 between the source finger electrode 120 and the gate finger electrode 124 and between the drain finger electrode 122 and the gate finger electrode 124.

As another fabrication method of the isolation region, it can also form by ion implantation to a part of depth direction of the aluminum gallium nitride layer ($Al_xGa_{1-x}N$) (where $0.1<=x<=1$) 18 and the nitride based compound semiconductor layer 112. As ion species, nitrogen (N), argon (Ar), etc. are applicable, for example. Moreover, the amount of dosage with the ion implantation is about $1\times10^{14}$ (ions/cm$^2$), for example, and accelerating energy is about 100 keV to 200 keV, for example.

On the isolation region and the device surface, a lower layer feed through for passivation (not shown) is formed. As the lower layer feed through, it can be formed of a nitride film, an alumina ($Al_2O_3$) film, an oxide film ($SiO_2$), an oxynitriding film (SiON), etc. deposited by a Plasma Enhanced Chemical Vapor Deposition (PECVD) method, for example.

The source finger electrode 120 and the drain finger electrode 122 are formed of Ti/Al etc., for example. The gate finger electrode 124 can be formed, for example of Ni/Au etc.

In addition, in the semiconductor device 24 which can be mounted in the package utilized for a high frequency semiconductor device according to the first to fourth embodiment, the pattern length of the longitudinal direction of the gate finger electrode 124, the source finger electrode 120, and the drain finger electrode 122 is set up to be short as the operating frequency becomes higher such as the microwave/millimeter wave/submillimeter wave. For example, in the millimeter wave band, the pattern length is about 25 µm to 50 µm.

Also, the width of the source finger electrode 120 is about 40 µm, for example, and the width of the source terminal electrode S11, S12, S21, S22, . . . , S101, and S102 is about 100 µm, for example. Yet also, the formation width of the VIA holes SC11, SC12, SC21, SC22, . . . , SC101, and SC102 is about 10 µm to about 40 µm, for example.

According to the above-mentioned embodiments, the production control can be easily achieved since the warping amount and the heat radiation characteristics can be fine-tuned by using the compound ratio and the thickness in the CTE control layer composed of compound material.

In addition, as the element applied to a high frequency module according to the embodiments, it needless to say that not only the FET and HEMT but also amplifying elements, such as a Laterally Doped Metal-Oxide-Semiconductor Field Effect Transistor (LDMOS) and a Hetero-junction Bipolar Transistor (HBT), and a Micro Electro Mechanical Systems (MEMS) element, etc. are applicable.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A package comprising:
a conductive base plate including
a CTE (coefficient of thermal expansion) control layer configured to be composed of compound material, and
a heat conduction layer configured to be disposed on the CTE control layer and composed of Cu; wherein
the CTE control layer is composed of a first compound material and a second compound material, a mixing ratio of the first compound material is increased with nearing the heat conduction layer, and a mixing ratio of the second compound material is increased with distance away from the heat conduction layer, along a thickness direction of the CTE control layer, wherein
the mixing ratio between the first compound material and the second compound material in the CTE control layer is 20%/80% to 80%/20%, and the thickness of the CTE control layer is 0.4 mm to 0.8 mm.

2. The package according to claim 1, wherein
the conductive base plate further comprises a thermal diffusion layer configured to intervene between the heat conduction layer and the CTE control layer.

3. The package according to claim 1, wherein
the conductive base plate further comprises a thermal diffusion layer configured to be disposed on the heat conduction layer.

4. The package according to claim 1, wherein the conductive base plate further comprises:
a first thermal diffusion layer configured to be disposed on the heat conduction layer; and
a second thermal diffusion layer configured to intervene between the heat conduction layer and the CTE control layer.

5. The package according to claim 2, wherein
the thermal diffusion layer is one of a compound of a carbon fiber and Cu, a compound of a carbon fiber and Al, a compound of a diamond and Cu and, a compound of a diamond and Al.

6. The package according to claim 1, wherein
the compound material is one of a compound of Cu and Mo, a compound of Cu and W, a compound of Al and Mo, and a compound of Al and W.

7. The package according to claim 1, wherein the conductive base plate further comprises:
a contact thermal resistance reducing layer configured to be disposed on a bottom surface of the CTE control layer to oppose to the heat conduction layer.

8. The package according to claim 7, wherein
the contact thermal resistance reducing layer is formed of Cu.

9. The package according to claim 1 further comprising:
a semiconductor device configured to be disposed on the conductive base plate;

a metal wall configured to be disposed on the conductive base plate to house the semiconductor device;
a through-hole configured to be disposed in input and output units of the metal wall;
a lower layer feed through configured to be inserted into the through-hole and disposed on the conductive base plate;
an upper layer feed through configured to be inserted into the through-hole and disposed on the lower layer feed through;
an input stripline configured to be disposed on the lower layer feed through in the input unit of the metal wall; and
an output stripline configured to be disposed on the lower layer feed through in the output unit of the metal wall.

10. The package according to claim 9 further comprising:
an input circuit substrate and an output circuit substrate configured be disposed, to adjoin of the semiconductor device, on the conductive base plate surrounded by the metal wall;
an input matching circuit configured to be disposed on the input circuit substrate and be connected to the input stripline;
an output matching circuit configured to be disposed on the output circuit substrate and be connected to the output stripline; and
a bonding wire configured to connect between the semiconductor device, and the input matching circuit and the output matching circuit.

11. The package according to claim 10 further comprising:
a metal seal ring configured to be disposed on the metal wall; and
a metal cap configured to be disposed on the metal seal ring.

12. The package according to claim 10, wherein the semiconductor device comprises:
a semi-insulating substrate;
a gate finger electrode, a source finger electrode, and a drain finger electrode configured to be placed on a first surface of the semi-insulating substrate and to have a plurality of fingers, respectively;
a plurality of gate terminal electrodes, a plurality of source terminal electrodes, and a drain terminal electrode configured to be disposed on the first surface of the semi-insulating substrate and to tie a plurality of fingers, respectively for every the gate finger electrode, the source finger electrode, and the drain finger electrode;
a VIA hole configured to be disposed at an under part of the source terminal electrode; and
a ground electrode configured to be disposed on a second surface of the opposite side of the first surface of the semi-insulating substrate, and be connected via the VIA hole for the source terminal electrode.

13. The package according to claim 12, wherein
the semi-insulating substrate is one of a GaAs substrate, an SiC substrate, a GaN substrate, a substrate formed of a GaN epitaxial layer on the SiC substrate, a substrate formed of a heterojunction epitaxial layer composed of GaN/AlGaN on the SiC substrate, a sapphire substrate, or a diamond substrate.

* * * * *